US009385187B2

(12) United States Patent
Pendharkar et al.

(10) Patent No.: US 9,385,187 B2
(45) Date of Patent: Jul. 5, 2016

(54) HIGH BREAKDOWN N-TYPE BURIED LAYER (71) Applicant: Texas Instruments Incorporated, Dallas, TX (US)

(72) Inventors: Sameer P Pendharkar, Allen, TX (US); Binghua Hu, Plano, TX (US); Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 72 days.

(21) Appl. No.: 14/555,330

(22) Filed: Nov. 26, 2014

(65) Prior Publication Data

US 2015/0311281 A1     Oct. 29, 2015

Related U.S. Application Data (60) Provisional application No. 61/984,205, filed on Apr. 25, 2014.

(51) Int. Cl.
| H01L 29/06  | (2006.01) |
| H01L 21/02  | (2006.01) |
| H01L 21/225 | (2006.01) |
| H01L 21/265 | (2006.01) |
| H01L 21/266 | (2006.01) |

(Continued)

(52) U.S. Cl.
CPC ...... *H01L 29/0623* (2013.01); *H01L 21/02164* (2013.01); *H01L 21/2253* (2013.01); *H01L 21/266* (2013.01); *H01L 21/26513* (2013.01); *H01L 21/324* (2013.01); *H01L 21/74* (2013.01); *H01L 29/167* (2013.01); *H01L 21/2652* (2013.01)

(58) Field of Classification Search
CPC ............ H01L 29/7835; H01L 29/0623; H01L 21/02164; H01L 21/2253; H01L 21/26513; H01L 21/266; H01L 21/324; H01L 29/167
See application file for complete search history.

(56) References Cited

U.S. PATENT DOCUMENTS 5,495,124 A * 2/1996 Terashima ............. H01L 21/74
                                                     257/369
5,994,755 A * 11/1999 DeJong ................... G05F 3/262
                                                     257/500

(Continued)

FOREIGN PATENT DOCUMENTS

| CN | 101937925 B   | 5/2011  |
| WO | 2008/086348 A3 | 8/2008  |
| WO | 2011/160041 A3 | 12/2011 |

OTHER PUBLICATIONS

International Search Report for corresponding PCT Application No. PCT/US2015/027699, dated Aug. 20, 2015.

*Primary Examiner* — Fernando L Toledo
*Assistant Examiner* — Neil Prasad
(74) *Attorney, Agent, or Firm* — Daniel Chan; Frank D. Cimino (57) ABSTRACT

A semiconductor device has an n-type buried layer formed by implanting antimony and/or arsenic into the p-type first epitaxial layer at a high dose and low energy, and implanting phosphorus at a low dose and high energy. A thermal drive process diffuses and activates both the heavy dopants and the phosphorus. The antimony and arsenic do not diffuse significantly, maintaining a narrow profile for a main layer of the buried layer. The phosphorus diffuses to provide a lightly-doped layer several microns thick below the main layer. An epitaxial p-type layer is grown over the buried layer.

10 Claims, 14 Drawing Sheets

(51) Int. Cl.
*H01L 21/324* (2006.01)
*H01L 29/167* (2006.01)
*H01L 21/74* (2006.01)

(56) References Cited

U.S. PATENT DOCUMENTS

2004/0207047 A1 10/2004 Khemka et al.
2005/0157756 A1 7/2005 Ormond
2007/0020926 A1* 1/2007 Kalvesten et al. ............ 438/667
2007/0246771 A1* 10/2007 McCormack et al. ........ 257/335
2008/0277764 A1* 11/2008 Ferru et al. .................... 257/618
2013/0134491 A1* 5/2013 Messenger et al. ........... 257/301
2013/0193502 A1* 8/2013 Kocon et al. .................. 257/302
2015/0097225 A1* 4/2015 Denison et al. ............... 257/329

* cited by examiner

HIGH BREAKDOWN N-TYPE BURIED LAYER

FIELD OF THE INVENTION

This invention relates to the field of semiconductor devices. More particularly, this invention relates to buried layers in semiconductor devices.

BACKGROUND OF THE INVENTION

A semiconductor device contains an n-type buried layer in a p-type substrate. The buried layer is biased to a high voltage, above 80 volts, to provide isolated operation at high voltage for a component in the substrate above the buried layer. The pn junction at the bottom surface of the buried layer exhibits undesirable leakage current and low breakdown.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device has an n-type buried layer over a p-type first epitaxial layer and under a p-type second epitaxial layer. The buried layer is formed by implanting heavy n-type dopants, antimony and/or arsenic, into the p-type first epitaxial layer at a high dose and low energy, and implanting a lighter n-type dopant, phosphorus, at a low dose and high energy. A thermal drive process diffuses and activates both the heavy dopants and the phosphorus. The heavy dopants do not diffuse significantly, advantageously maintaining a narrow profile for a main layer of the buried layer. The phosphorus diffuses to advantageously provide a lightly-doped layer several microns thick below the main layer.

DETAILED DESCRIPTION OF EXAMPLE EMBODIMENTS

The following co-pending patent applications are related and hereby incorporated by reference: U.S. patent application Ser. No. 14/555,209, U.S. patent application Ser. No. 14/555,300, and U.S. patent application Ser. No. 14/555,359, all filed simultaneously with this application).

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
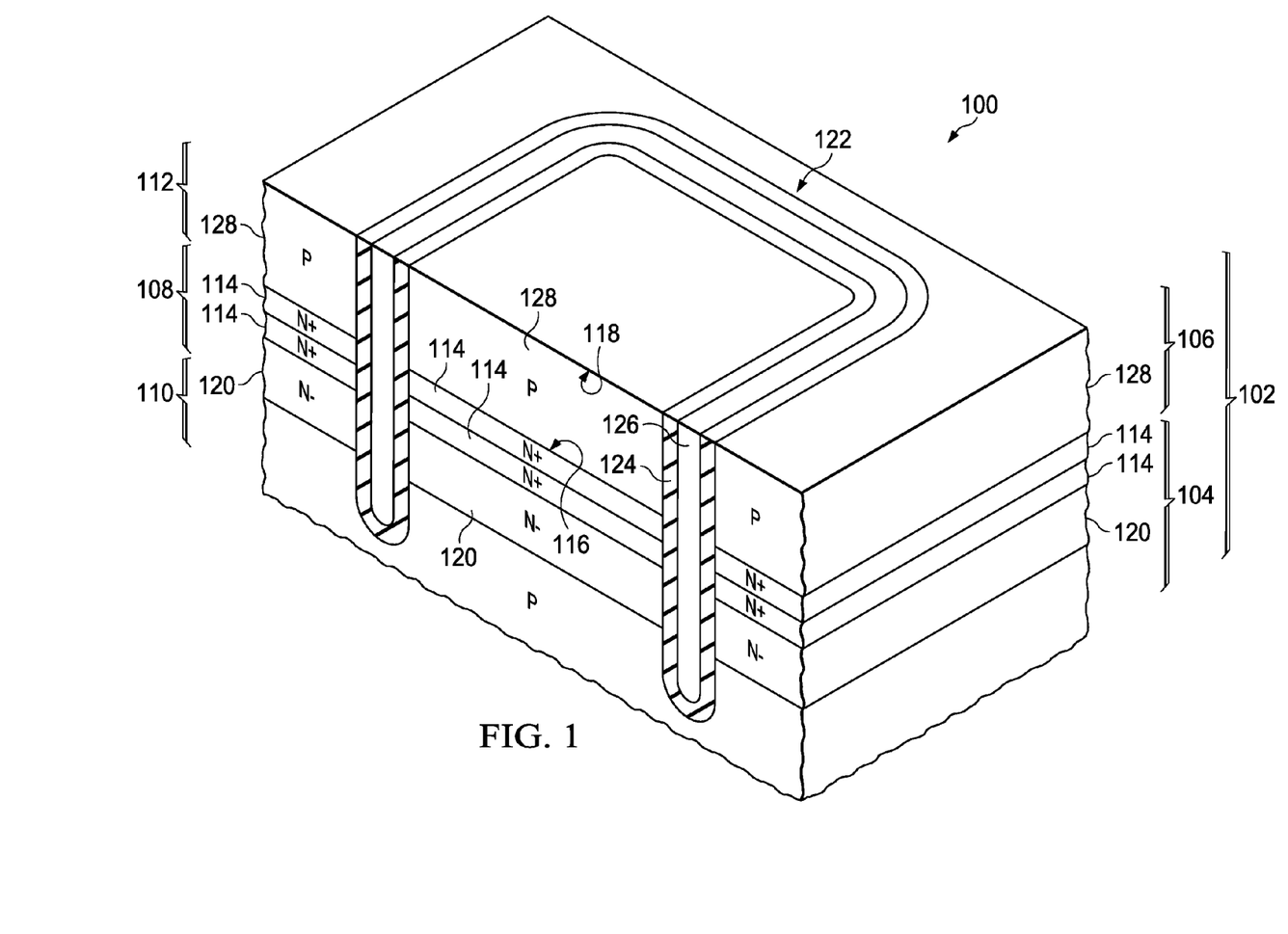
FIG. 1 is a cross section of an example semiconductor device containing a high voltage n-type buried layer.

FIG. 1 is a cross section of an example semiconductor device containing a high voltage n-type buried layer. The semiconductor device 100 has a substrate 102 which includes a first epitaxial layer 104 of semiconductor material such as single crystal silicon. The substrate 102 also includes a second epitaxial layer 106 disposed on the first epitaxial layer 104. The second epitaxial layer 106 comprises a semiconductor material which may have a same composition as the first epitaxial layer 104. An n-type buried layer 108 is disposed in the substrate 102 at a boundary between the first epitaxial layer 104 and the second epitaxial layer 106, extending into the first epitaxial layer 104 and the second epitaxial layer 106. The first epitaxial layer 104 immediately below the n-type buried layer 108 is referred to as a lower layer 110. The lower layer 110 is p-type and has a resistivity of 5 ohm-cm to 10 ohm-cm. The second epitaxial layer 106 above the n-type buried layer 108 is referred to as an upper layer 112. The upper layer 112 is p-type and has a resistivity of 5 ohm-cm to 10 ohm-cm.

The n-type buried layer 108 includes a main layer 114 which straddles the boundary between the first epitaxial layer 104 and the second epitaxial layer 106, extending at least a micron into the first epitaxial layer 104 and at least a micron into the second epitaxial layer 106. The main layer 114 has an average doping density greater than $5 \times 10^{18}$ cm$^{-3}$. At least 50 percent of the n-type dopants in the main layer 114 are arsenic and/or antimony. A top surface 116 of the main layer 114 is at least 5 microns below a top surface 118 of the substrate 102. The top surface 116 of the main layer 114 may be 8 microns to 12 microns below the top surface 118 of the substrate 102.

The n-type buried layer 108 includes a lightly-doped layer 120 extending at least 2 microns below the main layer 114; the lightly-doped layer 120 is disposed in the first epitaxial layer 104 over the lower layer 110. The lightly-doped layer 120 has an average doping density of $1 \times 10^{16}$ cm$^{-3}$ to $1 \times 10^{17}$ cm$^{-3}$. At least 90 percent of the n-type dopants in the lightly-doped layer 120 are phosphorus. The n-type buried layer 108 may extend substantially across the semiconductor device 100 as indicated in FIG. 1.

During operation of the semiconductor device 100, the n-type buried layer 108 may be biased 80 volts to 110 volts higher than the lower layer 110. The structure of the n-type buried layer 108 with the lightly-doped layer 120 may advantageously prevent breakdown of a pn junction between the n-type buried layer 108 and the lower layer 110, and may advantageously provide a desired low level of leakage current. Moreover, the structure of the n-type buried layer 108 with the main layer 114 advantageously provides a low sheet resistance so as to maintain a uniform bias for components in the upper layer 112 above the n-type buried layer 108.

The semiconductor device 100 may include a deep trench structure 122 which extends through the upper layer 112, through the n-type buried layer 108, and into the lower layer 110. The deep trench structure 122 includes a dielectric liner 124 including silicon dioxide contacting the semiconductor material of the substrate 102. The deep trench structure 122 may also include an electrically conductive fill material 126 such as polycrystalline silicon, referred to as polysilicon, on the dielectric liner 124. The structure of the n-type buried layer 108 with the lightly-doped layer 120 is especially advantageous for preventing breakdown of the pn junction between the n-type buried layer 108 and the lower layer 110 at the dielectric liner 124. The deep trench structure 122 may have a closed loop configuration as depicted in FIG. 1 so that a portion 128 of the upper layer 112 is electrically isolated from the remaining upper layer 112 by the deep trench structure 122 and is electrically isolated from the lower layer 110 by the n-type buried layer 108. Components in the portion 128 of the upper layer 112 may be advantageously operated at 85 volts to 110 volts components in the remaining upper layer 112 outside the deep trench structure 122.

Figure 2A:
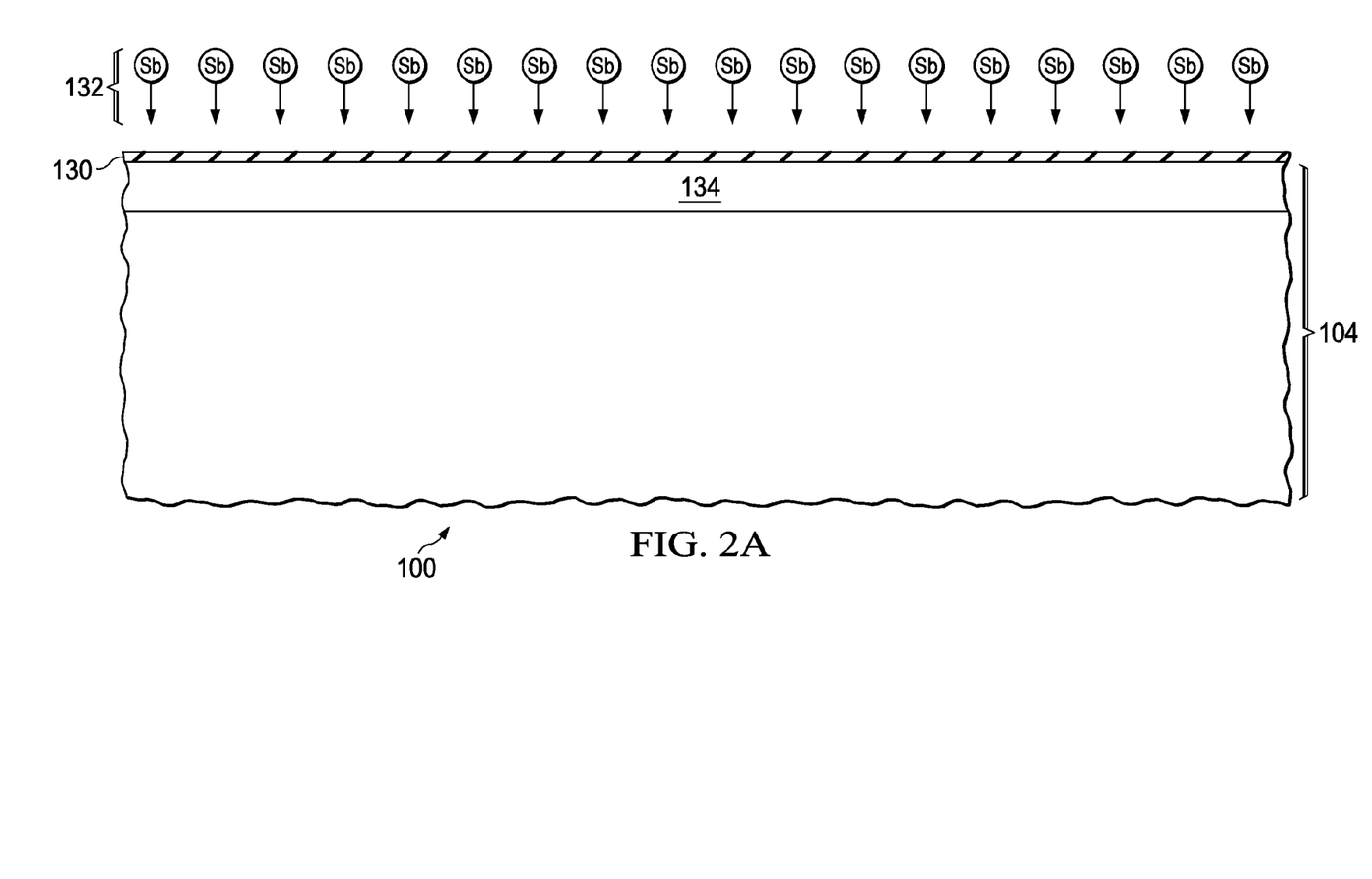
FIG. 2A through FIG. 2F are cross sections of a semiconductor device similar to that depicted in FIG. 1, shown in successive stages of fabrication.

FIG. 2A through FIG. 2F are cross sections of a semiconductor device similar to that depicted in FIG. 1, shown in successive stages of fabrication. Referring to FIG. 2A, fabrication of the semiconductor device 100 starts with the first epitaxial layer 104. The first epitaxial layer 104 may be, for example, a top portion of a stack of epitaxial layers on a heavily-doped single crystal silicon wafer. The first epitaxial layer 104 is p-type with a resistivity of 5 ohm-cm to 10 ohm-cm. A layer of pad oxide 130 is formed over the first epitaxial layer 104, for example by thermal oxidation.

N-type dopants 132 are implanted into the first epitaxial layer 104 to form a first implanted layer 134. The n-type dopants include at least 50 percent arsenic and/or antimony. In one version of the instant example, the n-type dopants 132 may be substantially all antimony, as indicated in FIG. 2A. The n-type dopants 132 are implanted at a dose greater than $5 \times 10^{14}$ cm$^{-2}$, for example, $1 \times 10^{15}$ cm$^{-2}$ to $5 \times 10^{15}$ cm$^{-2}$. Antimony in the n-type dopants 132 may be implanted at energies less than 50 keV. Arsenic in the n-type dopants 132 may be implanted at energies less than 40 keV.

Figure 2B:
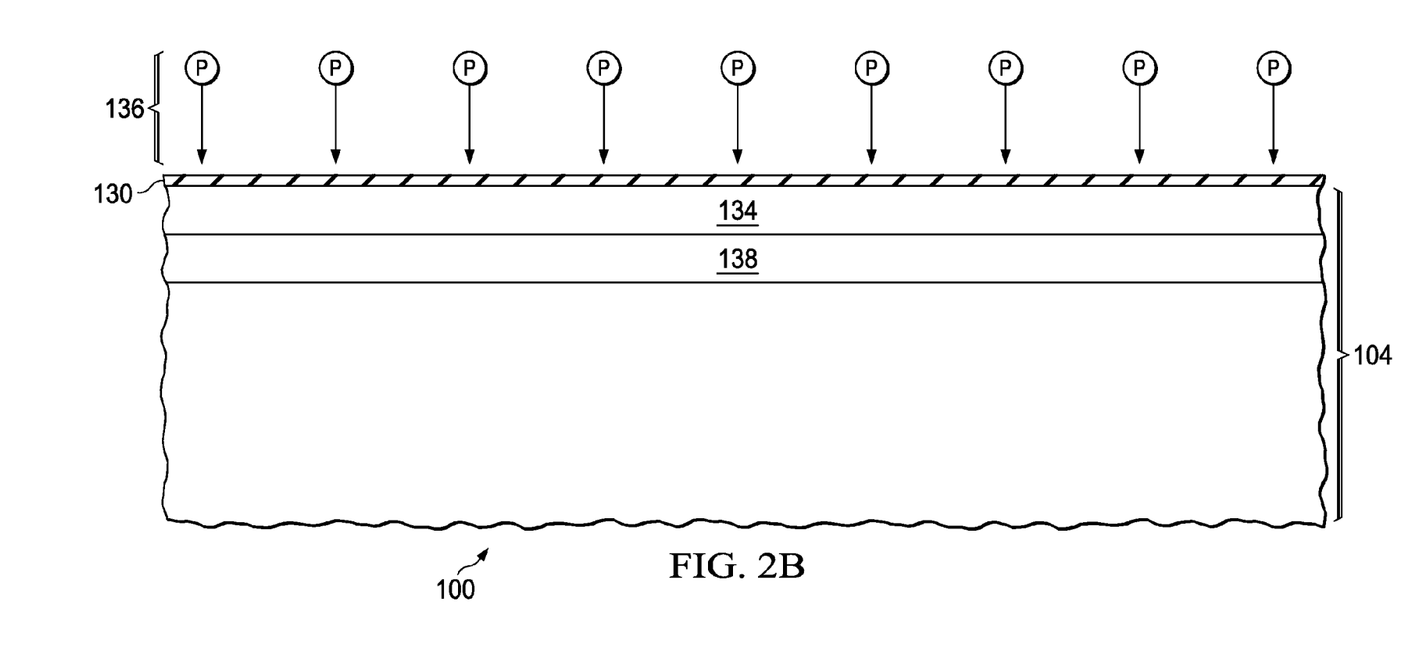

Referring to FIG. 2B, phosphorus 136 is implanted into the first epitaxial layer 104 to form a second implanted layer 138 below the first implanted layer 134. The phosphorus 136 is implanted at a dose of $1 \times 10^{13}$ cm$^{-2}$ to $1 \times 10^{14}$ cm$^{-2}$ and at an energy above 100 keV.

Figure 2C:
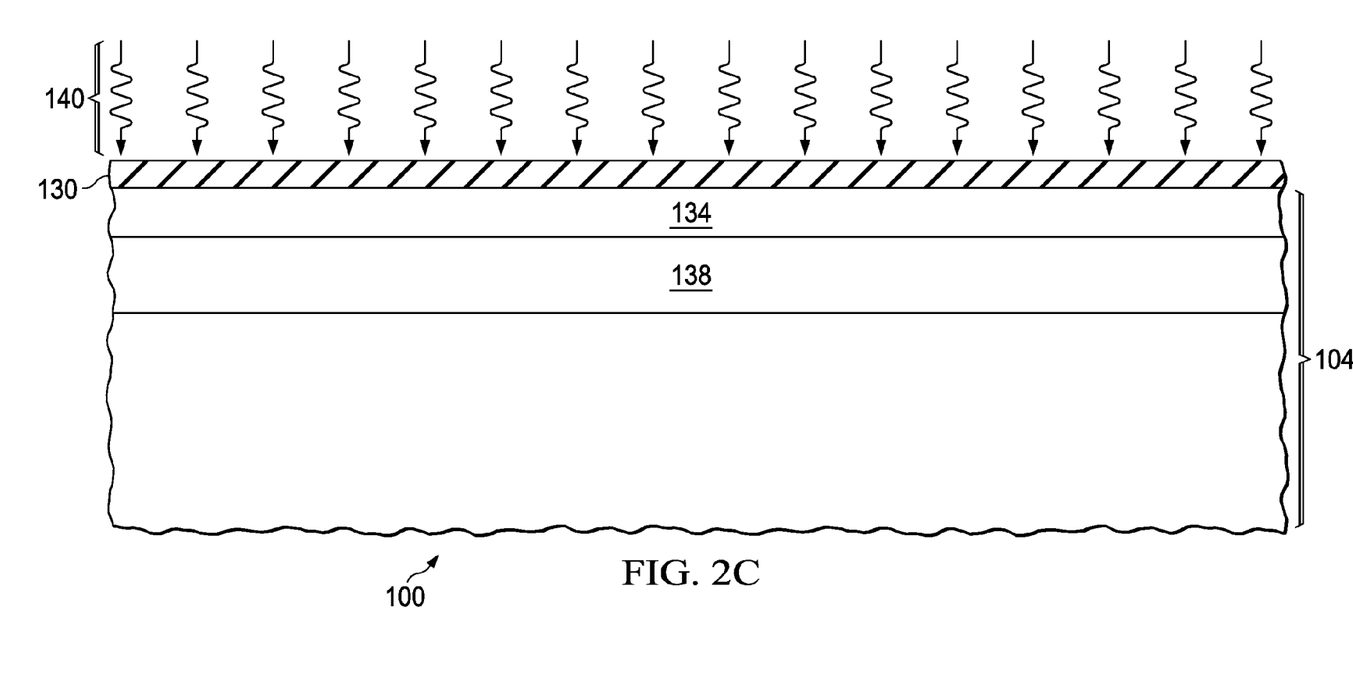

Referring to FIG. 2C, a first thermal drive process 140 heats the first epitaxial layer 104 to a temperature of 1150° C. to 1225° C. for at least 30 minutes. The first thermal drive process 140 may be performed in a furnace with an oxidizing ambient which increases a thickness of the layer of pad oxide 130. The first thermal drive process 140 causes the implanted n-type dopants in the first implanted layer 134 and the implanted phosphorus in the second implanted layer 138 to diffuse deeper into the first epitaxial layer 104. The phosphorus in the second implanted layer 138 diffuses farther into the first epitaxial layer 104 than the arsenic and antimony in the first implanted layer 134. The layer of pad oxide 130 is subsequently removed, for example by a wet etch using a dilute aqueous solution of buffered hydrofluoric acid.

Figure 2D:
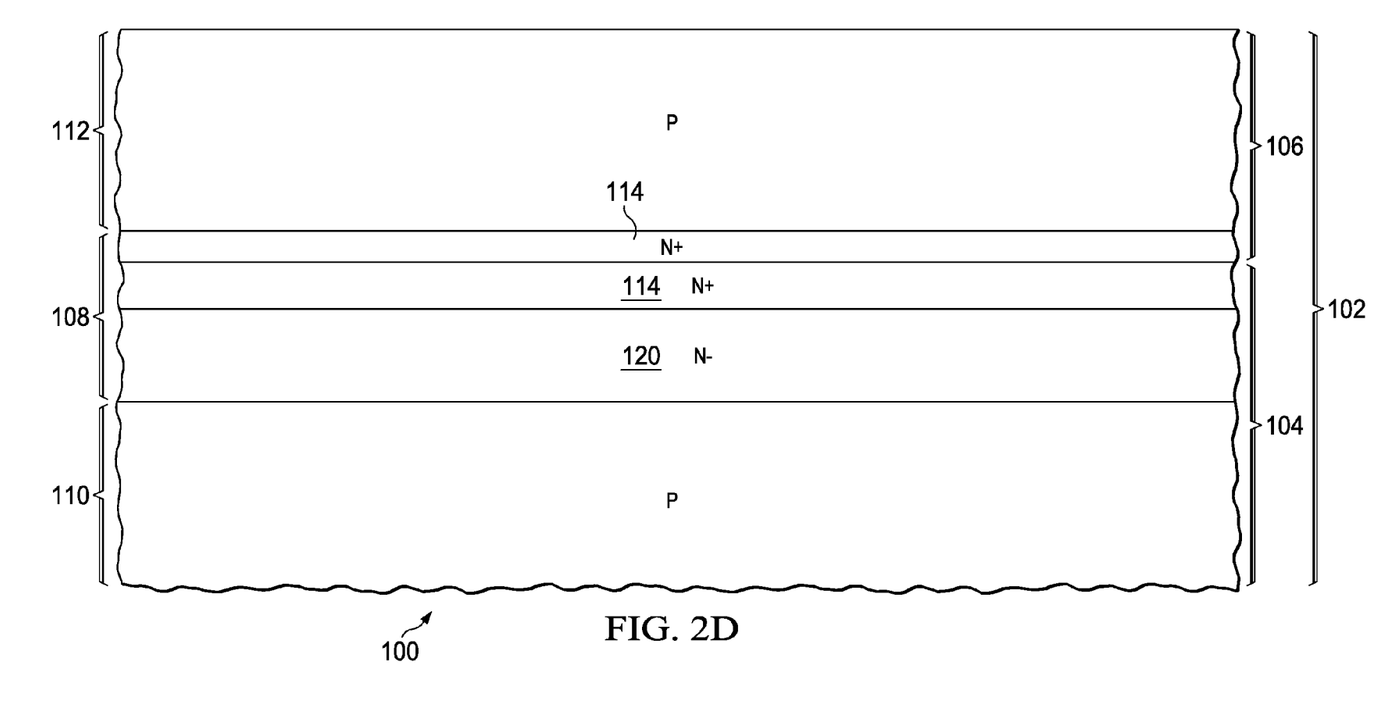

Referring to FIG. 2D, an epitaxy process grows the second epitaxial layer 106 on the first epitaxial layer 104. The epitaxy process may use silane, dichlorosilane, or other silicon-containing reagents. During the epitaxy process, the n-type dopants in the first implanted layer 134 of FIG. 2C diffuse into the second epitaxial layer 106, to form the main layer 114 of the n-type buried layer 108. The main layer 114 straddles the boundary between the first epitaxial layer 104 and the second epitaxial layer 106. The phosphorus in the second implanted layer 138 of FIG. 2C forms the lightly-doped layer 120 of the n-type buried layer 108. The epitaxy process may use a boron-containing reagent such as diborane to provide p-type doping in the second epitaxial layer 106. Alternatively, p-type dopants such as boron may be implanted into the second epitaxial layer 106 after the epitaxy process is completed. The first epitaxial layer 104 and the second epitaxial layer 106 provide a top portion of the substrate 102.

Figure 2E:
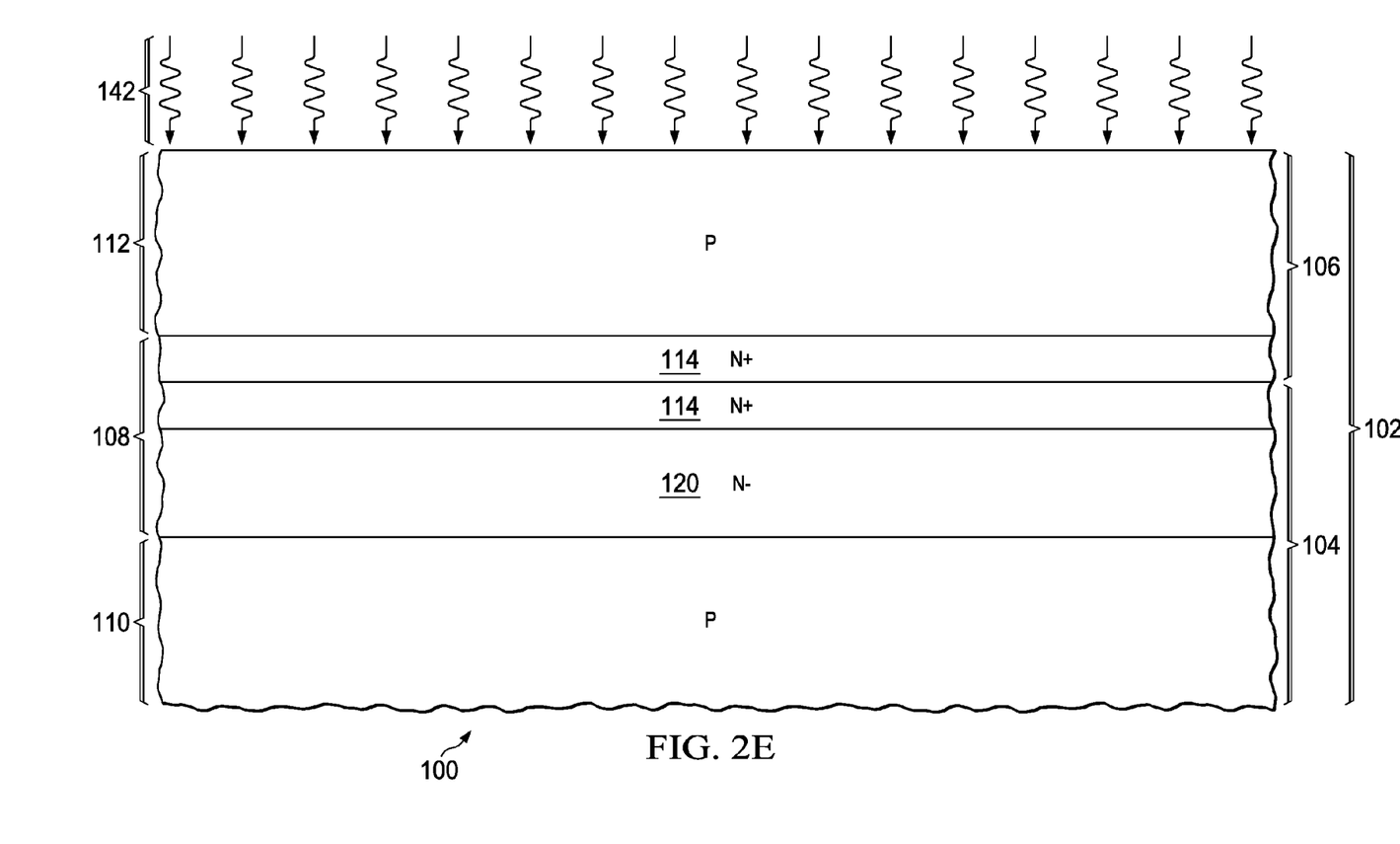

Referring to FIG. 2E, a second thermal drive process 142 heats the substrate 102 to a temperature of 1125° C. to 1200° C. for at least 120 minutes. The second thermal drive process 142 may be performed in a furnace with a slightly oxidizing ambient. When the second thermal drive is completed, the main layer 114 of the n-type buried layer 108 extends at least a micron into the first epitaxial layer 104 and at least a micron into the second epitaxial layer 106, and the lightly-doped layer 120 extends at least 2 microns below the main layer 114. An average doping in the main layer 114 is greater than $5 \times 10^{18}$ cm$^{-3}$. An average doping in the lightly-doped layer 120 is $1 \times 10^{16}$ cm$^3$ to $1 \times 10^{17}$ cm$^3$.

Figure 2F:
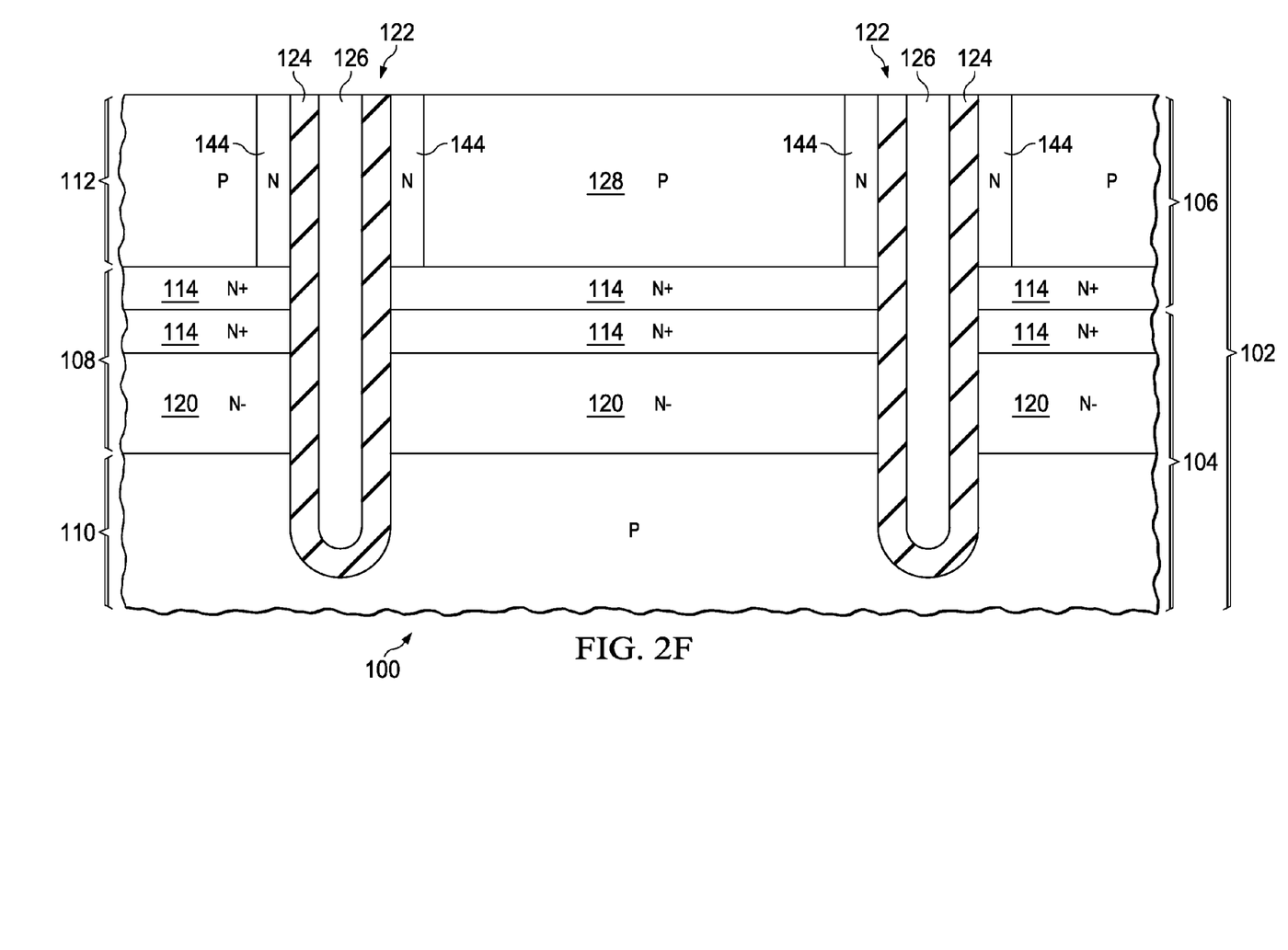

Referring to FIG. 2F, the deep trench structure 122 may be formed by etching a deep trench in the substrate 102 after the second thermal drive process 142 of FIG. 2E. The dielectric liner 124 may be formed by thermal oxidation followed by deposition of silicon dioxide by a sub-atmospheric chemical vapor deposition (SACVD) process. The electrically conductive fill material 126 may be formed by depositing a conformal layer of polysilicon and subsequently removing the polysilicon from over a top surface of the substrate, for example by a chemical mechanical polish (CMP) process. Optional n-type self-aligned sinkers 144 may be formed in the second epitaxial layer 106 abutting the deep trench structures by implanting n-type dopants into the second epitaxial layer 106 after the deep trenches are partially etched. The n-type self-aligned sinkers 144 provide electrical connections to the n-type buried layer 108.

Figure 3A:
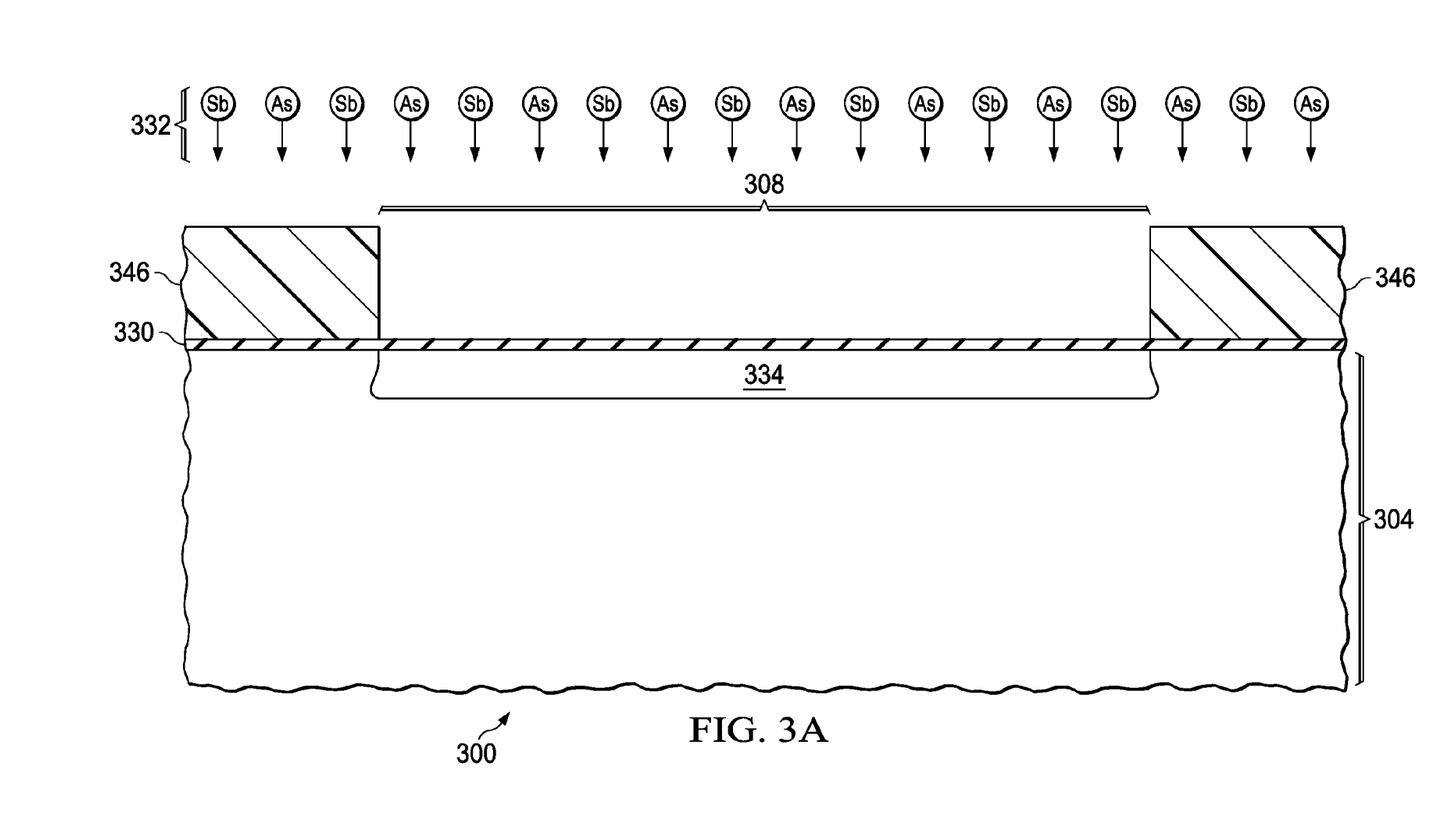
FIG. 3A through FIG. 3F are cross sections of another example semiconductor device containing a high voltage localized n-type buried layer, depicted in successive stages of fabrication.

FIG. 3A through FIG. 3F are cross sections of another example semiconductor device containing a high voltage localized n-type buried layer, depicted in successive stages of fabrication. A localized n-type buried layer extends across only a portion of the semiconductor device. Referring to FIG. 3A, the semiconductor device 300 is formed on a first epitaxial layer 304 containing a semiconductor material such as single crystal silicon. The first epitaxial layer 304 is p-type with a resistivity of 5 ohm-cm to 10 ohm-cm. A layer of pad oxide 330 is formed over the first epitaxial layer 304. In the instant example, an implant mask 346 is formed over the layer of pad oxide 330 so as to expose an area for the localized n-type buried layer 308. The implant mask 346 may include photoresist formed by a photolithographic process, or may include hard mask material such as silicon dioxide formed by a thermal oxidation or a plasma enhanced chemical vapor (PECVD) process. Including hard mask material in the implant mask 346 may advantageously facilitate subsequent removal of the implant mask 346 after implanting phosphorus at high energies.

N-type dopants 332 are implanted through the area exposed by the implant mask 346 into the first epitaxial layer 304 to form a first implanted layer 334. The n-type dopants includes at least 50 percent arsenic and/or antimony. The n-type dopants 332 are implanted at a dose greater than $5 \times 10^{14}$ cm$^{-2}$, for example, $1 \times 10^{15}$ cm$^{-2}$ to $5 \times 10^{15}$ cm$^{-2}$.

Figure 3B:
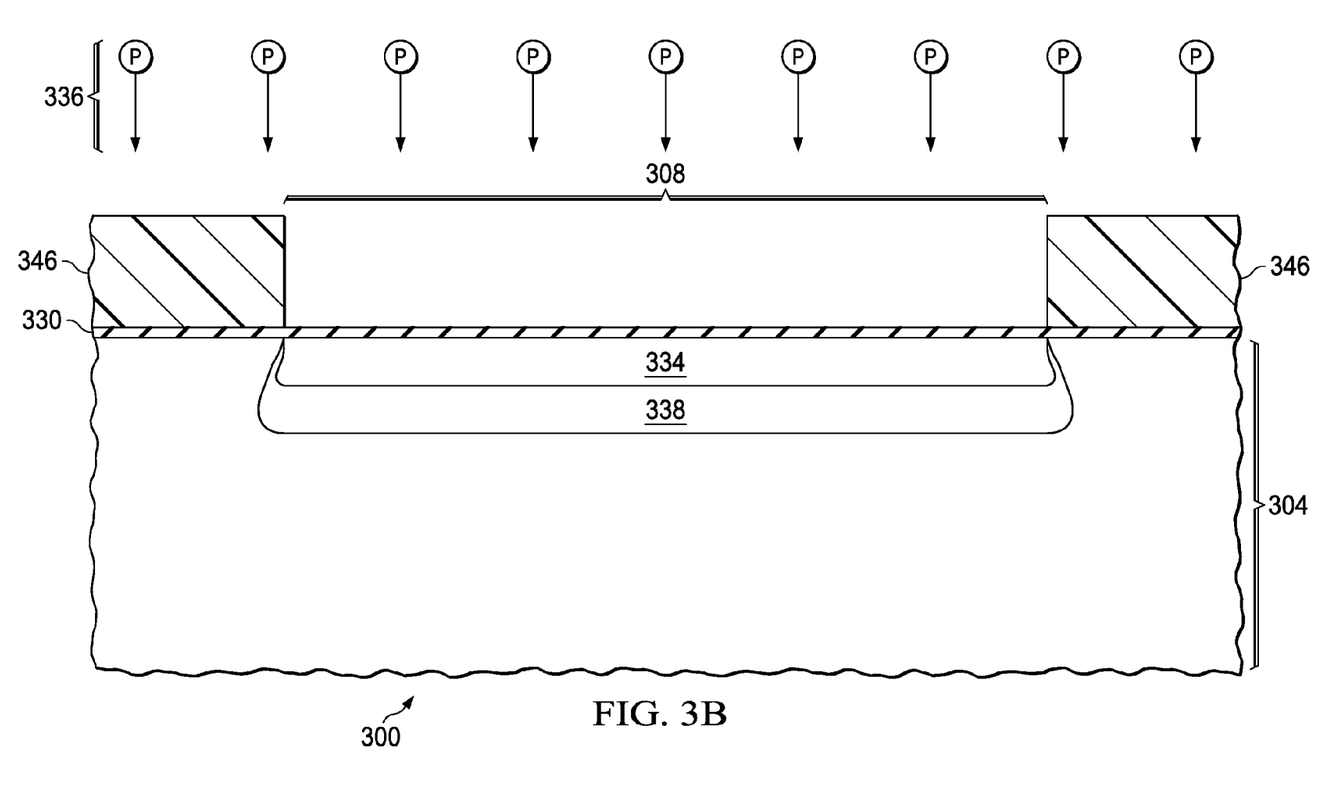

Referring to FIG. 3B, phosphorus 336 is implanted through the area exposed by the implant mask 346 into the first epitaxial layer 304 to form a second implanted layer 338 below the first implanted layer 334. The phosphorus 336 is implanted at a dose of $1 \times 10^{13}$ cm$^{-2}$ to $1 \times 10^{14}$ cm$^{-2}$ and at an energy above 100 keV. Organic material in the implant mask 346 such as photoresist is removed before a subsequent first thermal drive process.

Figure 3C:
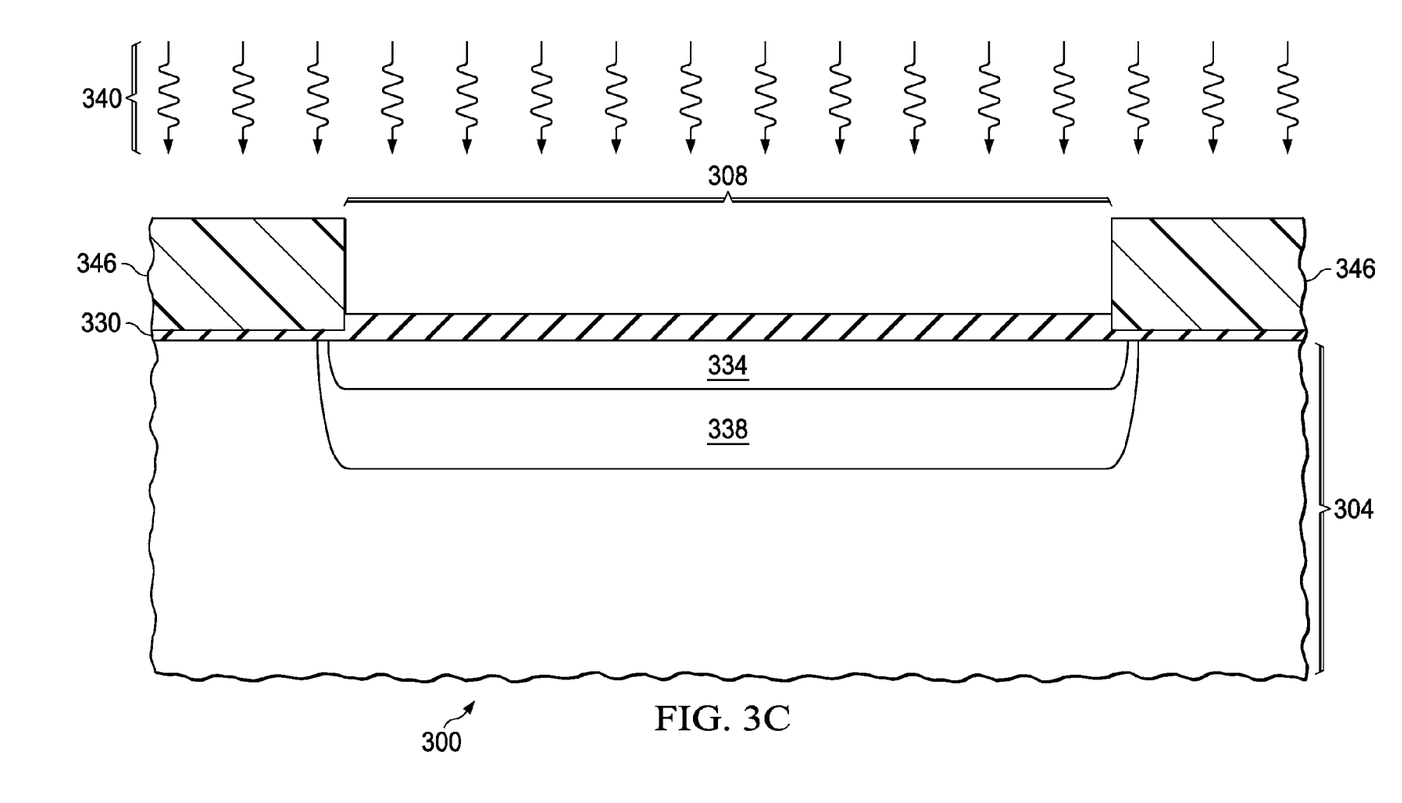

Referring to FIG. 3C, a first thermal drive process 340 heats the first epitaxial layer 304 to a temperature of 1150° C. to 1225° C. for at least 30 minutes, for example as described in reference to FIG. 2C. The first thermal drive process 340 causes the implanted n-type dopants in the first implanted layer 334 and the implanted phosphorus in the second implanted layer 338 to diffuse deeper into the first epitaxial layer 304. The phosphorus in the second implanted layer 338 diffuses farther into the first epitaxial layer 304 than the arsenic and antimony in the first implanted layer 334. The implant mask 346 if present and the layer of pad oxide 330 are subsequently removed.

Figure 3D:
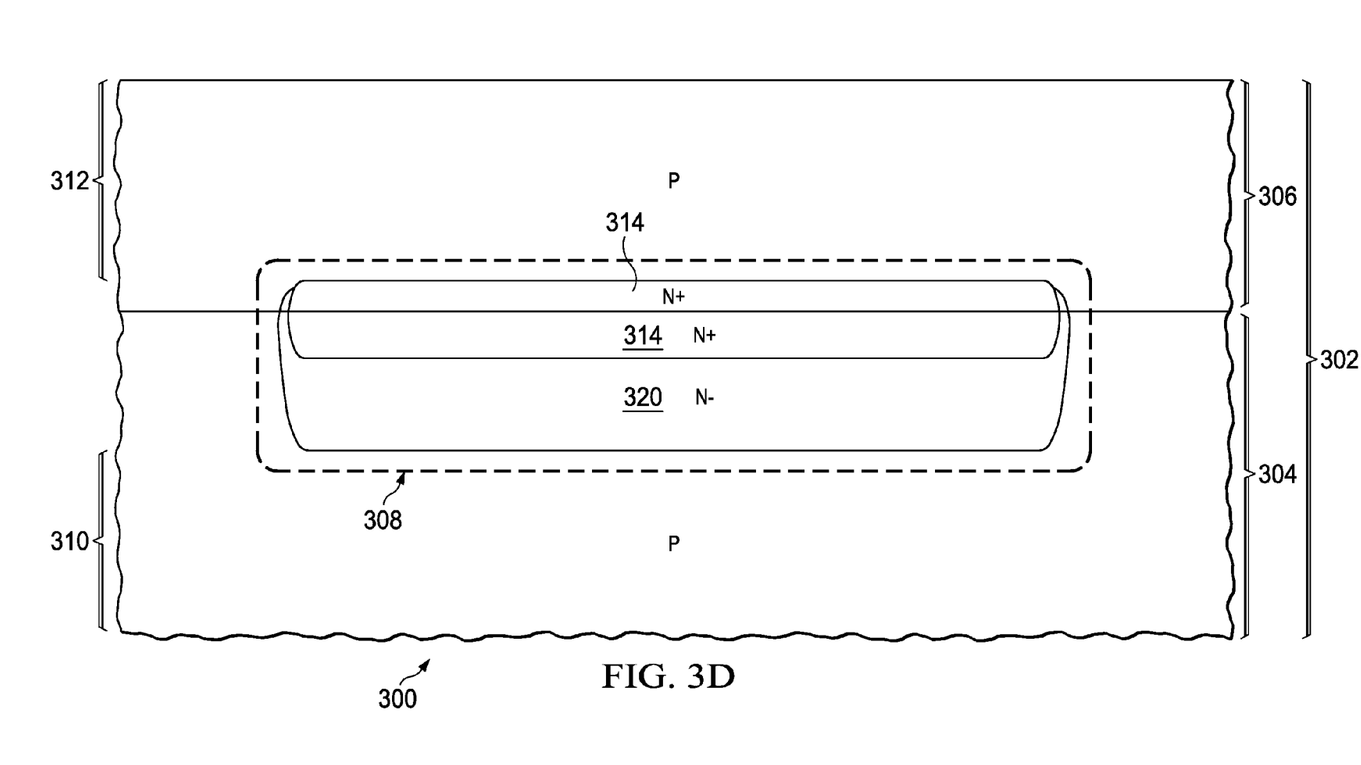

Referring to FIG. 3D, an epitaxy process grows a second epitaxial layer 306 on the first epitaxial layer 304 to provide a substrate 302 of the semiconductor device 300. During the epitaxy process, the n-type dopants in the first implanted layer 334 of FIG. 3C diffuse into the second epitaxial layer 306, to form a main layer 314 of the localized n-type buried layer 308. The main layer 314 straddles a boundary between the first epitaxial layer 304 and the second epitaxial layer 306. The phosphorus in the second implanted layer 338 of FIG. 3C forms a lightly-doped layer 320 of the localized n-type buried layer 308 below the main layer 314. The second epitaxial layer 306 is p-type with a resistivity of 5 ohm-cm to 10 ohm-cm. The first epitaxial layer 304 immediately below the n-type buried layer 308 is referred to as a lower layer 310; analogously, the second epitaxial layer 306 above the n-type buried layer 308 is referred to as an upper layer 312.

Figure 3E:
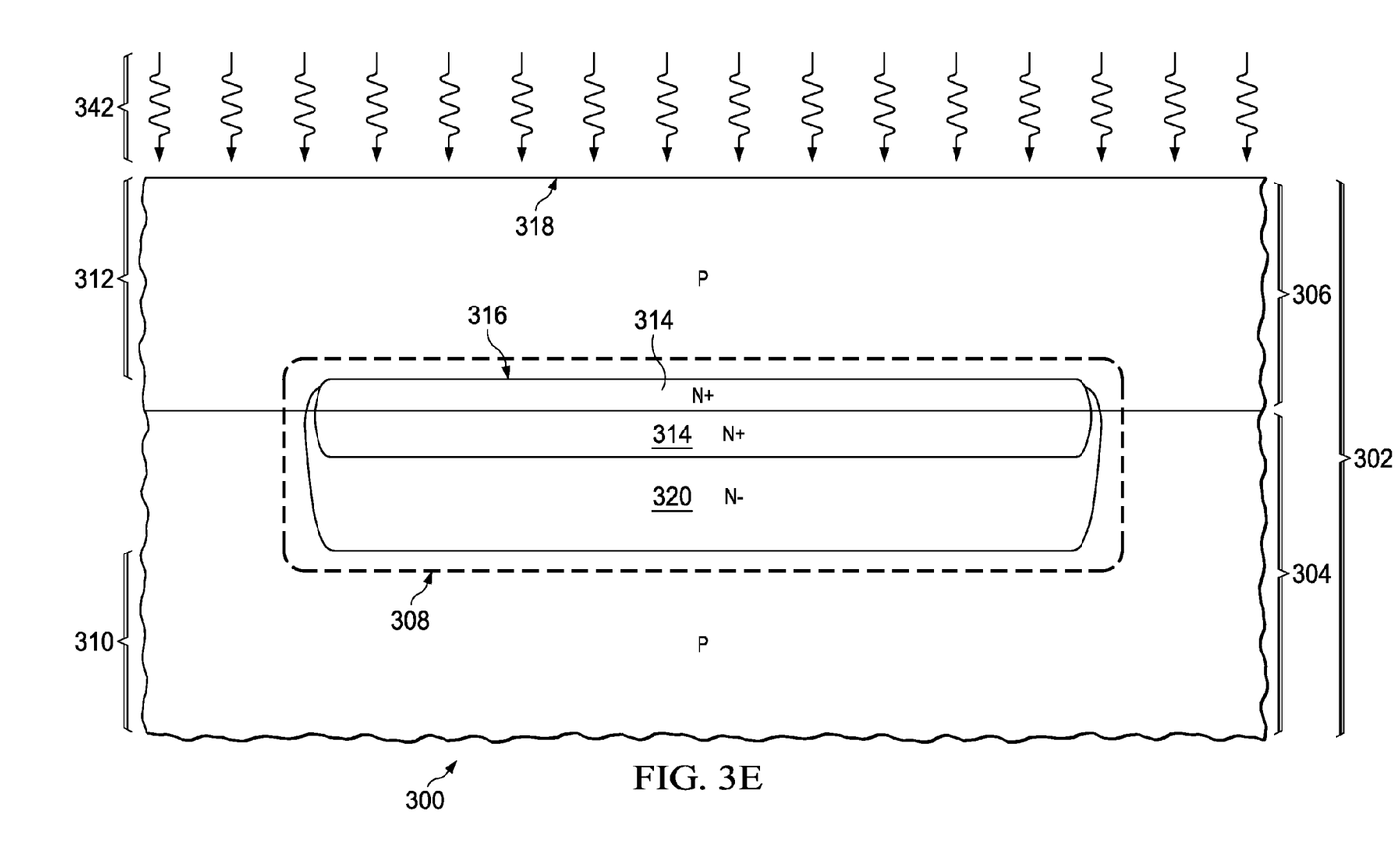

Referring to FIG. 3E, a second thermal drive process 342 heats the substrate 302 to a temperature of 1125° C. to 1200° C. for at least 120 minutes. When the second thermal drive is completed, the main layer 314 of the localized n-type buried layer 308 extends at least a micron into the first epitaxial layer 304 and at least a micron into the second epitaxial layer 306, and the lightly-doped layer 320 extends at least 2 microns below the main layer 314. A top surface 316 of the main layer 314 is at least 5 microns below a top surface 318 of the substrate 302. The top surface 316 of the main layer 314 may be 8 microns to 12 microns below the top surface 318 of the substrate 302. An average doping in the main layer 314 is greater than $5\times10^{18}$ cm$^{-3}$. At least 50 percent of the n-type dopants in the main layer 314 are arsenic and/or antimony.

The lightly-doped layer 320 extends at least 2 microns below the main layer 314. An average doping in the lightly-doped layer 320 is $1\times10^{16}$ cm$^{-3}$ to $1\times10^{17}$ cm$^{-3}$. At least 90 percent of the n-type dopants in the lightly-doped layer 320 are phosphorus.

Figure 3F:
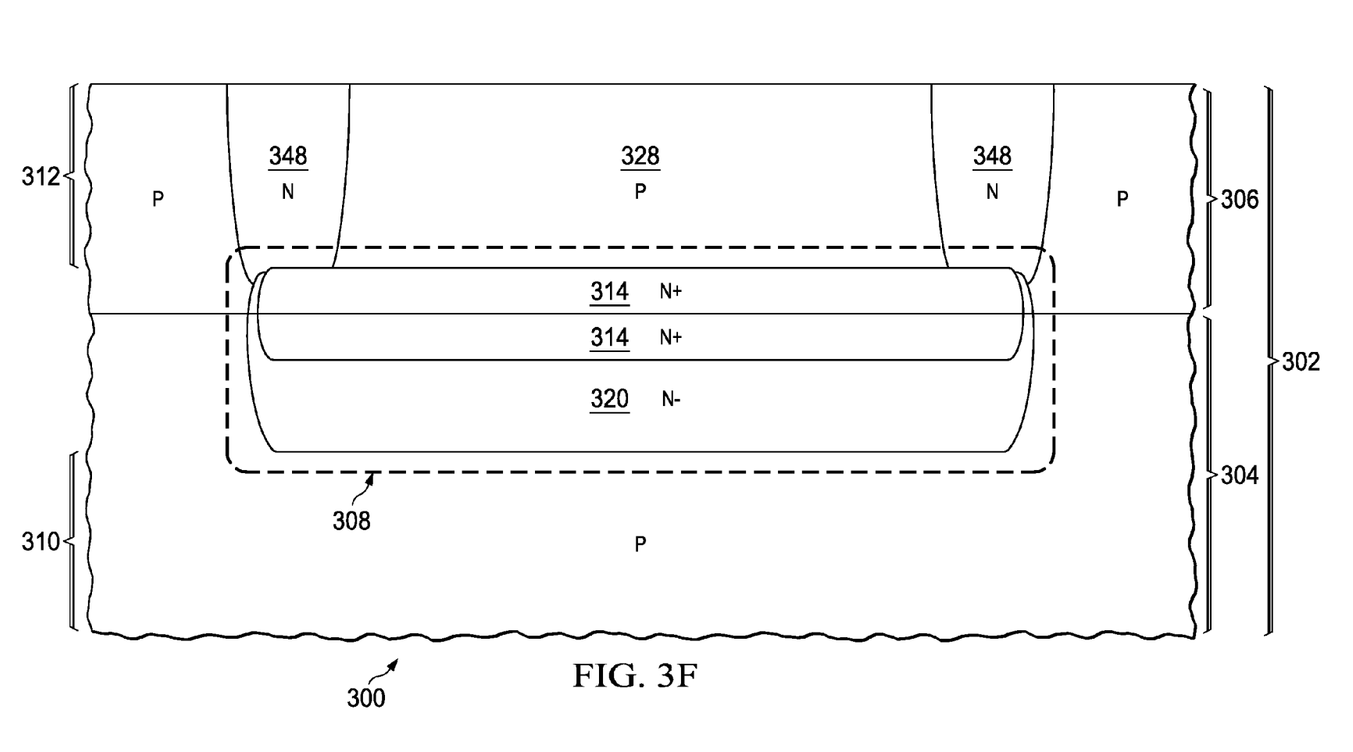

Referring to FIG. 3F, n-type sinkers 348 are formed in the second epitaxial layer 306, extending down to the localized n-type buried layer 308. The n-type sinkers 348 may have a closed-loop configuration so as to isolate a portion 328 of the upper layer 312 from the remaining upper layer 312. The localized n-type buried layer 308 isolates the portion 328 of the upper layer 312 from the lower layer 310. The structure of the localized n-type buried layer 308 with the main layer 314 and the lightly-doped layer 320 may advantageously provide a low sheet resistance in the localized n-type buried layer 308 while reducing leakage current and preventing breakdown of a pn junction between the localized n-type buried layer 308 and the lower layer 310.

Figure 4:
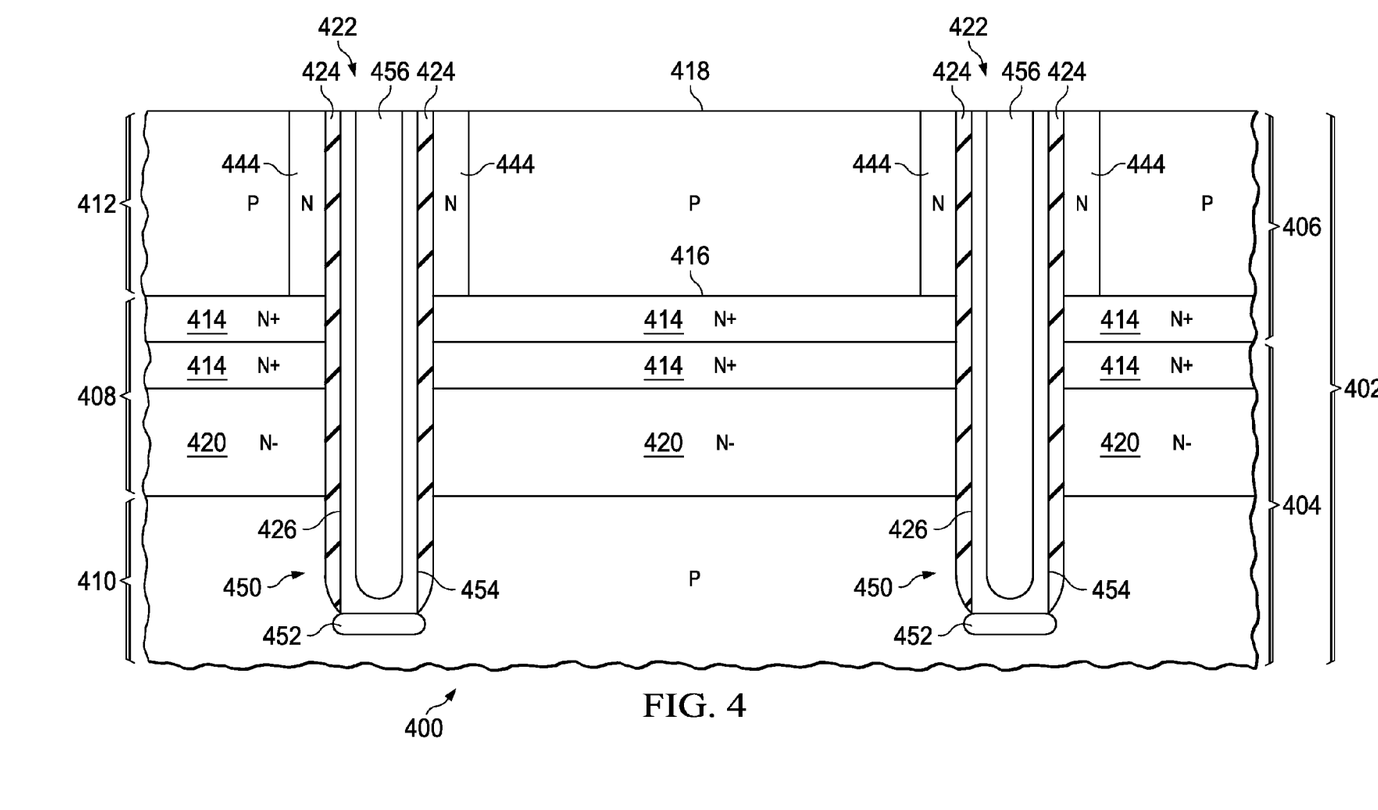
FIG. 4 is a cross section of an alternate example semiconductor device containing a high voltage n-type buried layer.

FIG. 4 is a cross section of an alternate example semiconductor device containing a high voltage n-type buried layer. The semiconductor device 400 has a substrate 402 which includes a first epitaxial layer 404 of p-type semiconductor material such as single crystal silicon. The substrate 402 also includes a second epitaxial layer 406 disposed on the first epitaxial layer 404. The second epitaxial layer 406 comprises a p-type semiconductor material which may have a same composition as the first epitaxial layer 404. An n-type buried layer 408 is disposed in the substrate 402 at a boundary between the first epitaxial layer 404 and the second epitaxial layer 406, extending into the first epitaxial layer 404 and the second epitaxial layer 406. The first epitaxial layer 404 immediately below the n-type buried layer 408 is referred to as a lower layer 410. The lower layer 410 is p-type and has a resistivity of 5 ohm-cm to 10 ohm-cm. The second epitaxial layer 406 above the n-type buried layer 408 is referred to as an upper layer 412. The upper layer 412 is p-type and has a resistivity of 5 ohm-cm to 10 ohm-cm.

The n-type buried layer 408 includes a main layer 414 which straddles the boundary between the first epitaxial layer 404 and the second epitaxial layer 406, extending at least a micron into the first epitaxial layer 404 and at least a micron into the second epitaxial layer 406. The main layer 414 has an average doping density greater than $5\times10^{18}$ cm$^{-3}$. A top surface 416 of the main layer 414 is at least 5 microns below a top surface 418 of the substrate 402. The top surface 416 of the main layer 414 may be 8 microns to 12 microns below the top surface 418 of the substrate 402 The n-type buried layer 408 includes a lightly-doped layer 420 extending at least 2 microns below the main layer 414; the lightly-doped layer 420 is disposed in the first epitaxial layer 404 over the lower layer 410. The lightly-doped layer 420 has an average doping density of $1\times10^{16}$ cm$^{-3}$ to $1\times10^{17}$ cm$^{-3}$. The n-type buried layer 408 may be formed as described in any of the examples herein.

One or more deep trench structures 422 are disposed in the substrate 402, extending below the buried layer 408 into the lower layer 410. The deep trench structures 422 include dielectric liners 424 contacting the substrate 402. The deep trench structures 422 include electrically conductive trench fill material 426 on the dielectric liners 424. In the instant example, the dielectric liner 424 is removed at bottoms 450 of the deep trench structures 422 and the trench fill material 426 extends to the substrate 402, making electrical connection to the substrate 402 through a p-type contact region 452. The contact region 452 and the method of removing the dielectric liner 424 at the bottom 450 of each deep trench structure 422 may be done as described in the commonly assigned patent application having patent application Ser. No. 14/555,359, filed concurrently with this application, and which is incorporated herein by reference.

In the instant example, the trench fill material 426 includes a first layer of polysilicon 454 disposed on the dielectric liner 424, extending to the bottoms 450 of the deep trench structures 422, and a second layer of polysilicon 456 is disposed on the first layer of polysilicon 454. Dopants are distributed in the first layer of polysilicon 454 and the second layer of polysilicon 456 with an average doping density of at least $1\times10^{18}$ cm$^{-3}$. The trench fill material 426 may be formed as described in the commonly assigned patent application having patent application Ser. No. 14/555,300, filed concurrently with this application, and which is incorporated herein by reference.

N-type self-aligned sinkers 444 are disposed in the upper layer 412 abutting the deep trench structures 422 and extending to the buried layer 408. The self-aligned sinkers 444 provide electrical connections to the buried layer 408. The self-aligned sinkers 444 may be formed as described in the commonly assigned patent application having patent application Ser. No. 14/555,209, filed concurrently with this application, and which is incorporated herein by reference.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising the steps:
    providing a first epitaxial layer of a substrate comprising p-type semiconductor material;
    implanting first n-type dopants into the substrate at a first dose to form a first implantation layer;
    implanting second n-type dopants into the substrate at a second dose less than the first dose and at an energy above 100 keV to form a second implementation layer; and
    heating the substrate in a first thermal drive process at a temperature of 1150° C. to 1225° C. for at least 30 minutes to define a p-type epitaxial layer in the substrate and form an n-type buried layer positioned above the p-type epitaxial layer, the n-type buried layer including:
        a main layer having a first doping concentration and a buried top surface below a top surface of the substrate; and
        a lightly-doped layer positioned above the p-type epitaxial layer and below the main layer, the lightly-doped layer having a second doping concentration lower than the first doping concentration.

2. The method of claim 1, wherein the p-type semiconductor material in the first p-type epitaxial layer has a resistivity of 5 ohm-cm to 10 ohm-cm.

3. The method of claim 1, wherein the first n-type dopants include antimony and are implanted at the first dose greater than $5 \times 10^{14}$ cm$^{-2}$.

4. The method of claim 1, wherein the first n-type dopants include phosphorus and are implanted into across the substrate.

5. The method of claim 1, wherein the first n-type dopants include phosphorus and are implanted into the substrate through areas exposed by an implant mask so that the n-type buried layer includes a localized n-type buried layer.

6. The method of claim 1, further comprising heating the substrate in a second thermal drive process at a second temperature of 1125° C. to 1200° C. for at least 120 minutes after the first p-type epitaxial layer is defined.

7. The method of claim 1, further comprising forming a deep trench in the substrate extending from the top surface of the substrate through the n-type buried layer to reach the first p-type epitaxial layer without penetrating through the substrate, and forming a dielectric liner coating a bottom portion of the deep trench and contacting the substrate.

8. The method of claim 7, wherein the deep trench has a closed-loop configuration defined on the top surface of the substrate.

9. The method of claim 7, further comprising implanting third n-type dopants into the substrate adjacent to the deep trench after the deep trench is formed so as to form n-type self-aligned sinkers in the substrate to abutting the buried top surface of the n-type buried layer.

10. The method of claim 1, further comprising forming an n-type sinker in the substrate extending to the buried top surface of the n-type buried layer, the n-type sinker having a closed-loop configuration.

* * * * *